United States Patent
Shea et al.

(10) Patent No.: US 11,217,987 B2
(45) Date of Patent: Jan. 4, 2022

(54) ARC SUPPRESSION IN CIRCUIT PROTECTIVE DEVICES

(71) Applicant: Schneider Electric USA, Inc., Andover, MA (US)

(72) Inventors: John J. Shea, Knightdale, NC (US); Julius M. Liptak, Knightdale, NC (US)

(73) Assignee: Schneider Electric USA, Inc., Boston, MA (US)

( * ) Notice: Subject to any disclaimer, the term of this patent is extended or adjusted under 35 U.S.C. 154(b) by 0 days.

(21) Appl. No.: 16/731,023

(22) Filed: Dec. 30, 2019

(65) Prior Publication Data

US 2021/0203150 A1   Jul. 1, 2021

(51) Int. Cl.
*H02H 1/00* (2006.01)
*H02H 7/00* (2006.01)
*G01R 31/12* (2020.01)

(52) U.S. Cl.
CPC ............ *H02H 7/008* (2013.01); *G01R 31/12* (2013.01); *H02H 1/0015* (2013.01)

(58) Field of Classification Search
CPC ....... H02H 1/0015; H02H 7/008; G01R 31/12
See application file for complete search history.

(56) References Cited

U.S. PATENT DOCUMENTS

| 2002/0097542 | A1 | 7/2002 | Perichon | |
|---|---|---|---|---|
| 2013/0335861 | A1* | 12/2013 | Laschinski | H02H 1/0015 361/2 |
| 2019/0103742 | A1* | 4/2019 | Kennedy | H02H 7/22 |

FOREIGN PATENT DOCUMENTS

| DE | 102011082339 A1 | 3/2013 |
|---|---|---|
| WO | 2014042941 A1 | 3/2014 |

OTHER PUBLICATIONS

Extended Search Report for EP Application No. 20212846, dated Jun. 14, 2021, 9 pages.

* cited by examiner

*Primary Examiner* — Bryan R Perez
(74) *Attorney, Agent, or Firm* — Locke Lord LLP

(57) ABSTRACT

Methods and systems for suppressing arc formation in branch breakers provide a load center that can monitor a branch breaker for indications of arc formation. The load center may include a main breaker that can immediately cut current to the upon receiving an indication of an arc forming in the branch breaker. The indication may be provided by a sensor circuit that sends a trigger signal to the main breaker when arc formation is detected within the branch breaker. The main breaker checks that the trigger signal indicates arc formation, then cuts current to suppress the arc. The main breaker then waits a short period for the branch breaker to clear before restoring current. The wait period is sufficiently short such that devices receiving power from the load center are not adversely affected. To improve cutoff and restoration response times, the main breaker employs a solid-state trip switch.

15 Claims, 8 Drawing Sheets

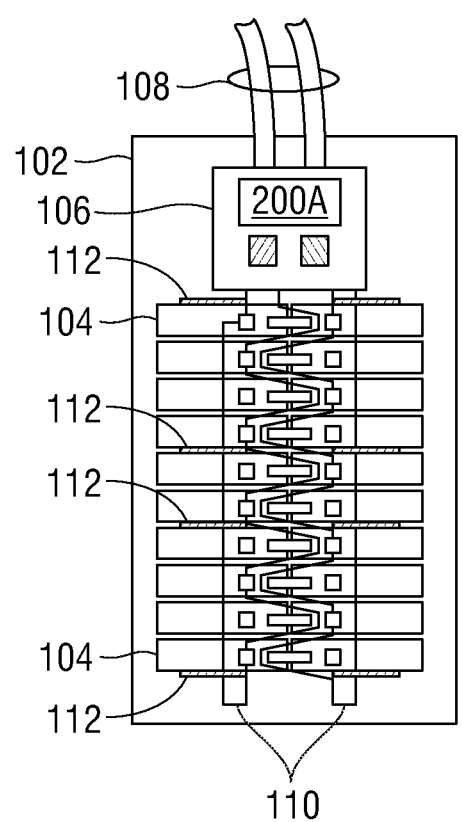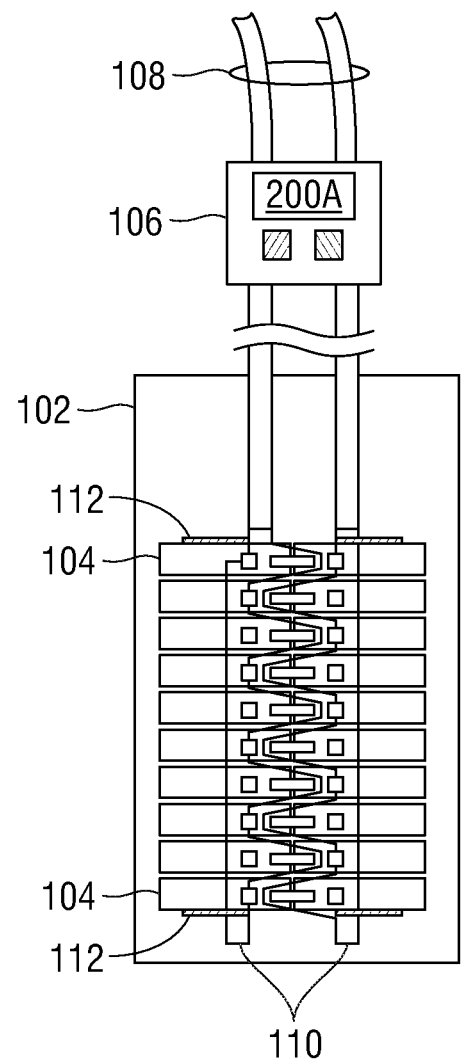
FIG. 1B  FIG. 1C

ARC SUPPRESSION IN CIRCUIT PROTECTIVE DEVICES

TECHNICAL FIELD

The present disclosure relates to electrical distribution panels and load centers and, more particularly, to methods and systems for implementing load centers that can detect and suppress arc formation in branch circuit breakers without adversely affecting other devices connected to the load centers.

BACKGROUND

Arcing refers to an electrical discharge through a normally nonconductive gas, usually air. In a load center, arcing can occur between any exposed conductors of different electrical potentials, such as between adjacent busbars or a busbar and ground, as well as between current-carrying contacts in the branch circuit breakers. When a branch breaker trips and the current-carrying contacts start to separate, an arc can form across the air gap between the two contacts as current continues flowing until the contacts attain sufficient separation.

Arcing can produce extremely hot gasses, vaporized metals/polymers, and other harmful byproducts. These arc byproducts can damage circuit breaker components, causing them to wear out more quickly than usual, and even rendering the breakers no longer operational in some cases. As a result, circuit breakers are required to be constructed from heavier and stronger materials and have bigger casings in order to provide a large enough contact chamber to satisfy industry standards and ratings requirements.

Accordingly, as can be readily appreciated, improvements are needed in the field of electrical distribution panels and load centers, particularly with respect to arcing in the branch breakers of such load centers.

SUMMARY

The present disclosure provides methods and systems for implementing electrical distribution panels and load centers that can detect and suppress arc formation in branch breakers. The methods and systems provide a load center that is equipped to monitor a branch breaker for indications of an arc being formed. The load center may include a main breaker that can immediately cut current flow upon receiving an indication of an arc forming in a branch breaker. The indication may be provided by a sensor mounted on or near the branch breaker that sends a trigger signal to the main breaker when arc formation is detected within the branch breaker. The main breaker then determines whether the trigger signal satisfies a certain condition or conditions indicative of arc formation. If so, the main breaker cuts current flow to suppress the arc, then waits a short period of time while the branch breaker clears before restoring current flow. The wait period is preferably short enough such that devices receiving power from the load center are not adversely affected by the interruption in current flow. To improve current cutoff and restoration response times, the main breaker employs a solid-state trip switch capable of extremely fast switching times.

In general, in one aspect, embodiments of the present disclosure relate to a load center. The load center comprises, among other things, a plurality of branch breakers, and at least one sensor coupled to the plurality of branch breakers. The at least one sensor is configured to sense a parameter indicative of arc formation in one of the branch breakers. The load center further comprises a solid-state main breaker coupled to receive a trigger signal from the at least one sensor. The solid-state main breaker is configured to determine whether the trigger signal satisfies a predefined arcing condition and, in response, temporarily interrupt current flow to the plurality of branch breakers and wait for a predefined event before restoring current flow to the plurality of branch breakers.

In accordance with any one or more of the foregoing embodiments, the at least one sensor comprises one sensor coupled to each of the plurality of branch breakers or one sensor coupled to multiple ones of the plurality of branch breakers.

In accordance with any one or more of the foregoing embodiments, the at least one sensor includes a voltage sensor and the parameter is voltage induced by arc formation in one of the branch breakers, and the load center further comprises a signal conditioning circuit connected to the voltage sensor, or the at least one sensor includes a radio frequency sensor and the parameter is radio frequency energy generated by arc formation in one of the branch breakers.

In accordance with any one or more of the foregoing embodiments, the predefined event is one of a predefined time period or an immediately next zero-crossing of a load center voltage, and the predefined time period is a half cycle of a load center current.

In general, in another aspect, embodiments of the present disclosure relate to a main breaker for a load center. The main breaker comprises, among other things, a solid-state trip switch configured to provide current flow to a plurality of branch breakers, and a breaker controller configured to control switching of the solid-state trip switch. The breaker controller is operable to receive a trigger signal resulting from a fault condition in one of the branch breakers and determine whether the trigger signal satisfies a predefined condition. The breaker controller is further operable to temporarily interrupt current flow to the branch breakers and wait for a predefined event before restoring current flow to the branch breakers in response the trigger signal satisfying the predefined condition.

In accordance with any one or more of the foregoing embodiments, the predefined condition is one of a predefined logic level or a predefined arcing condition, and the predefined arcing condition includes the trigger signal having one or more of a predefined waveform, shape, amplitude, and duration.

In accordance with any one or more of the foregoing embodiments, the trigger signal is received from at least one sensor coupled the branch breakers and represents one of a voltage induced by arc formation in one of the branch breakers or radio frequency energy generated by arc formation in one of the branch breakers.

In accordance with any one or more of the foregoing embodiments, the predefined event is one of a predefined time period or an immediately next zero-crossing of a main breaker voltage, and the predefined time period is a half cycle of a main breaker current.

In general, in yet another aspect, embodiments of the present disclosure relate to a method of suppressing arc formation in a load center. The method comprises, among other things, receiving, at a main breaker, a trigger signal resulting from a fault condition in one of a plurality of branch breakers in the load center, and determining, at the main breaker, whether the trigger signal satisfies a predefined condition. The method further comprises temporarily interrupting, at the main breaker, current flow to the plurality of branch breakers in response to the trigger signal satisfying the predefined condition, and restoring, at the main breaker, current flow to the plurality of branch breakers after occurrence of a predefined event.

In accordance with any one or more of the foregoing embodiments, the method further comprises coupling a sensor to each of the plurality of branch breakers or coupling at least one sensor to multiple ones of the plurality of branch breakers.

In accordance with any one or more of the foregoing embodiments, the predefined condition is one of a predefined logic level or a predefined arcing condition, and the predefined arcing condition includes the trigger signal having one or more of a predefined waveform, shape, amplitude, and duration.

In accordance with any one or more of the foregoing embodiments, the trigger signal is received from at least one sensor coupled the branch breakers, further comprising conditioning the trigger signal at a signal conditioning circuit connected to the at least one sensor.

In accordance with any one or more of the foregoing embodiments, the trigger signal represents one of a voltage induced by arc formation in one of the branch breakers or radio frequency energy generated by arc formation in one of the branch breakers.

In accordance with any one or more of the foregoing embodiments, the predefined event is one of a time period equal to a half cycle of a load center current, or an immediately next zero-crossing of a load center voltage.

BRIEF DESCRIPTION OF THE DRAWINGS

A more detailed description of the disclosure, briefly summarized above, may be had by reference to various embodiments, some of which are illustrated in the appended drawings. While the appended drawings illustrate select embodiments of this disclosure, these drawings are not to be considered limiting of its scope, for the disclosure may admit to other equally effective embodiments.

FIGS. 1A-1C are schematic diagrams illustrating exemplary load centers that can suppress arc formation in branch circuit breakers according to embodiments of the present disclosure;

Identical reference numerals have been used, where possible, to designate identical elements that are common to the figures. However, elements disclosed in one embodiment may be beneficially utilized on other embodiments without specific recitation.

DETAILED DESCRIPTION

Referring now to FIG. 1, an exemplary building or facility 100 is shown having one or more electrical distribution panels or load centers 102 that can suppress arc formation in branch breakers according to embodiments of the present disclosure. The facility 100 may be any facility where load centers like the load centers 102 are deployed, such as a chemical processing facility, a manufacturing facility, a warehouse facility, and the like. These facilities typically include various electronic devices, machinery, and equipment that rely on continuous current flow from the load centers 102 to operate properly. An interruption in current flow of sufficient duration can cause these devices to abruptly shut down, which can result in equipment damage, loss and/or corrupted data, various safety hazards, and the like, potentially leading to expensive and lengthy recovery and repair. Accordingly, the one or more load centers 102 disclosed herein are designed to minimally interrupt current flow when performing arc suppression to avoid adversely affecting these electronic devices.

Figure 1A:
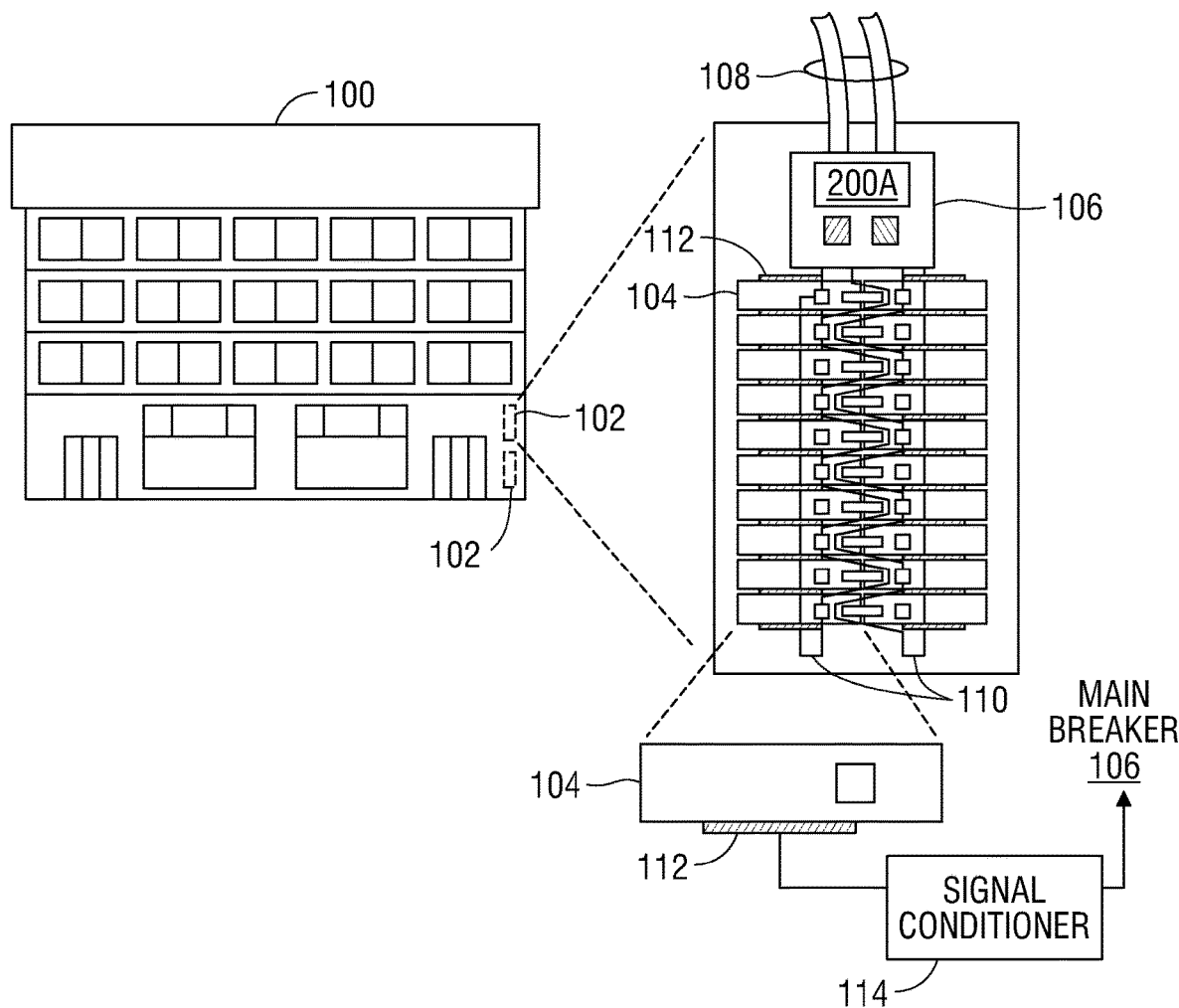

As FIG. 1A shows, each load center 102 includes a plurality of branch circuit breakers 104 and a main circuit breaker 106 that provide fault (e.g., short-circuit, overcurrent, etc.) protection for various electronic devices powered by the load center 102. The main breaker 106 protects the overall load center 102 while each branch breaker 104 protects one of several branch circuits (not expressly shown) that extend throughout the building 100. Current flows from an AC main power line 108 into the main breaker 106 down busbars 110 and out through the branch breakers 104. A trip switch in the main breaker 106 connects/disconnects the power line 108 to/from the busbars 110. The main breaker 106 controls this trip switch to automatically cut current flow to the busbars 110 when a fault occurs, and otherwise allows the current to flow through the busbars 110.

In the FIG. 1A example, each of the branch breakers 104 has a sensor 112 attached to or near an outer casing of the breaker that allows the main breaker 106 to monitor arc formation within the breaker. An arc emits a strong electromagnetic field that can be detected by various types of sensors known to those skilled in the art. One sensor that may be used to detect an arc within the breaker 104 is an E-Dot sensor, which is a type of capacitive sensor. The E-Dot sensor uses a circular plate made of a suitably conductive material, such as copper, to detect an electromagnetic field. When the plate nears an electromagnetic field like that generated by an arc, the field time rate of change (dE/dt) induces a voltage in the plate that can be outputted as a signal. The signal serves as a trigger signal that is indicative of arc formation within the breaker 104 for purposes of the present disclosure. Other types of sensors may of course be used within the scope of the present disclosures.

In general operation, when an arc begins to form in one of the branch breakers 104 (i.e., because that breaker has tripped), the sensor 112 for that breaker detects the electromagnetic field generated by the arc and outputs a corresponding signal. This trigger signal is then conditioned (e.g., smoothed, filtered, amplified, etc.) by a signal conditioner circuit 114 as needed, then sent to the main breaker 106 for further processing. The main breaker 106 processes the trigger signal to determine whether the signal satisfies a predefined condition that indicates arc formation. The determination may include, for example, whether the signal has a waveform that resembles a certain pattern and/or shape, whether the signal exceeds a certain amplitude, duration, and/or other threshold, and the like. If the trigger signal satisfies the condition or conditions indicative of arc formation, the main breaker 106 cuts current flow to the busbars 110 by opening the trip switch to the power line 108.

Without current flow to sustain it, the arc loses energy and quickly dissipates, resulting in significantly less damage to the branch breaker 104 than would otherwise occur.

After a brief wait period, the main breaker 106 closes the trip switch for the power line 108 to restore current flow to the busbars 110. As alluded to earlier, the time period that the main breaker 106 waits before restoring current flow is long enough to allow the tripped branch breaker 104 to clear, but short enough to avoid adversely affecting electronic devices on other branch breakers 104 (e.g., causing the devices to abruptly shut down). In some embodiments, the main breaker 106 bases this wait period on a predefined event, such as an immediately next zero-crossing of the load center voltage, a fixed amount of time (e.g., a half cycle of the load center current), and other predefined events that are suitably short to avoid adversely affecting electronic devices. In preferred embodiments, the wait period is less than 8 milliseconds (msec), as a current loss of less than 8 msec does not adversely affect most electronic devices.

The main breaker 106 needs to have extremely fast switching times in order to perform the above current flow interruption, wait period, and restoration. Therefore, in preferred embodiments, the main breaker 106 is a type of breaker that uses a solid-state trip switch, such as a silicon carbide (SiC) transistor-based trip switch. Silicon carbide transistors, such as SiC MOSFET and Si CoolMOS, have extremely fast switching times (e.g., $t_{switch}$<1 μsec) and low drain-source resistance (e.g., $R_{ds(on)}$<1 mΩ) at full current load, and thus are well suited for use as a main breaker in the load center embodiments herein. Commercially available examples include solid-state digital circuit breakers available from Atom Power, Inc., of Charlotte, N.C. These Atom Power intelligent digital circuit breakers can reportedly switch up to several thousand times faster than conventional thermal-mechanical circuit breakers.

Conventional thermal-mechanical circuit breakers, on the other hand, are well suited for use as the branch breakers 104, which do not require sub-microsecond switching times for normal operations. Examples include molded case circuit breakers (MCCB), miniature circuit breakers (MCB), and other commonly-used load center circuit breakers. Indeed, in alternative embodiments of the load center 102, the branch breakers 104 need not be breakers at all, but may instead resemble simple relay switches. Such simple relay switches only need to satisfy switching duty ratings (e.g., 120V/240V, 15 A, 20 A, etc.), as fault protection and other more traditional breaker functionality could be provided by the main breaker 106. Preferably the relay switches are remotely operable to allow them to be set/reset via a wired or wireless connection, an Internet connection, or other remote connections.

FIG. 1B depicts another alternative embodiment of the load center 102 in which the main breaker 106 uses one sensor 112 to monitor multiple branch breakers 104 instead of a single breaker 104. This reduces the number of sensors 112 that need to be mounted within the load center 102, with the specific number of sensors 112 used being chosen as needed depending on a particular application. Each sensor 112 should of course have sufficient sensitivity to detect arc formation within one or several nearby breakers 104 without being directly attached to the breakers. Signal conditioner circuits (not expressly shown) may be provided to condition the output signals from the sensors 112 as warranted.

FIG. 1C depicts yet another alternative load center 102 embodiment in which the main breaker 106 is mounted separately from instead of within the load center 102. For example, the main breaker 106 may be mounted at a different location in the same utility room as the load center 102, or in a separate utility room, or in another part of the facility 100, and the like. As well, in this embodiment, the main breaker 106 uses still fewer sensors 112 than the embodiment of FIG. 1B to monitor arc formation in the branch breakers 104. For example, there may be a sensor 112 mounted only at opposite ends for each row of branch breakers 104. Again, signal conditioner circuits (not expressly shown) may be provided to condition the output signals from the sensors 112 as needed.

Figure 2A:
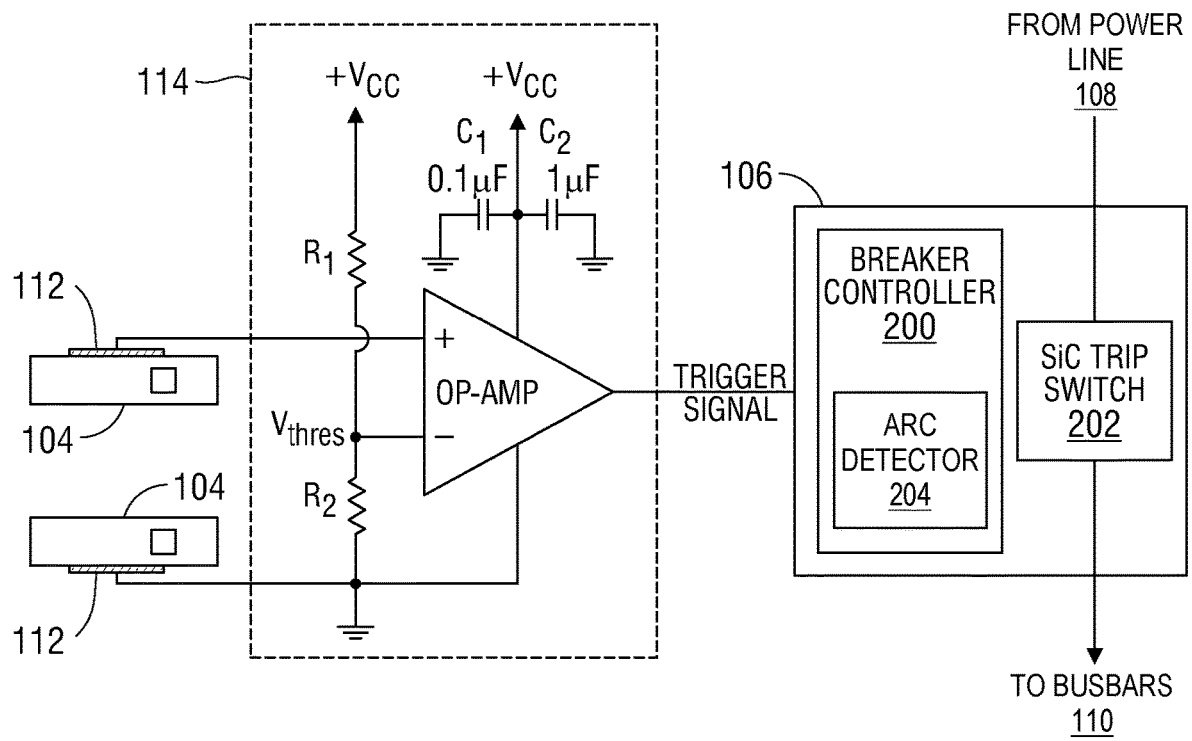
FIGS. 2A-2C are block diagrams illustrating exemplary sensor circuits that can detect arc formation in branch circuit breakers according to embodiments of the present disclosure.

An exemplary signal conditioner circuit 114 is shown in FIG. 2A together with an exemplary main breaker 106 according to embodiments of the present disclosure. The signal conditioner circuit 114 in this example is a typical single-ended amplifier circuit composed of an operational amplifier (op-amp) connected as shown. Specifically, the op-amp non-inverting input is connected to one sensor 112, while the inverting input is tied to a fixed threshold voltage $V_{thres}$. The threshold voltage $V_{thres}$ is set by a voltage divider network composed of resistors R1 and R2 and may be selected as needed depending on the particular application. Capacitors C1 and C2 provide smoothing for the op-amp positive voltage supply $+V_{cc}$, while the op-amp negative voltage supply is grounded along with a second sensor 112. Suitable commercially available op-amps that may be used in this embodiment include the LM339 op-amp from Texas Instruments, Inc., of Dallas, Tex. These LM339 op-amps and similar op-amps typically come in sufficiently small packages to allow the signal conditioner circuit 114 to be mounted within one of the branch breakers 104.

The above signal conditioner circuit 114 operates to amplify any voltage at the op-amp non-inverting input (i.e., from sensor 112) and outputs the amplified signal as a trigger signal to the main breaker 106. The main breaker 106, as discussed above, comes from a line of solid-state digital circuit breakers with extremely fast switching times. These intelligent digital breakers typically have a breaker controller 200 and a silicon-carbide transistor-based trip switch 202, among other components. The breaker controller 200 is programmed to provide various breaker functionality, including current and voltage monitoring, fault detection, and the like. When a fault condition is detected, such as a short-circuit or an overcurrent, the breaker controller 200 outputs a command to the trip switch 202 to shut off current flow to the busbars 110 (e.g., by turning off one or more transistors that form the trip switch).

In accordance with embodiments of the present disclosure, the breaker controller 200 may also be programmed with an arc detector module 204 that provides arc detection functionality. When the trigger signal is received by the breaker controller 200, the arc detector module 204 determines whether the trigger signal satisfies a predefined condition indicative of arc formation (e.g., matches a certain pattern and/or shape, exceeds a certain amplitude and/or duration, etc.). Such a predefined condition may be derived, for example, by tripping one of the branch breakers 104 in a controlled setting and analyzing the resulting signal generated by the sensor 112 and signal conditioner circuit 114. If the trigger signal satisfies the condition or conditions that indicate arc formation, then the arc detector module 204 causes the breaker controller 200 to interrupt current flow to the busbars 110. The detector module 204 thereafter causes the breaker controller 200 to wait for occurrence of a predefined event (e.g., next voltage zero-crossing, time interval of a current half cycle, etc.), then restore current flow to the busbars 110 (e.g., by turning on one or more transistors that form the trip switch).

Figure 2B:
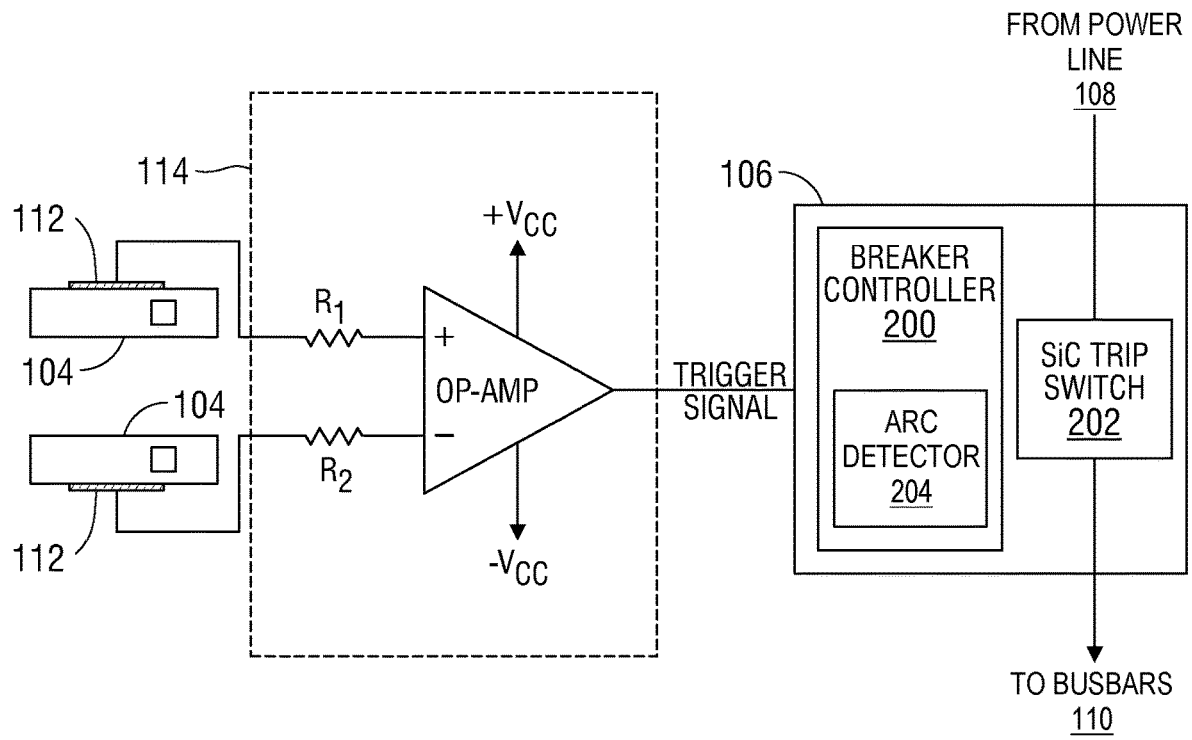

FIG. 2B shows another exemplary signal conditioner circuit 114 according to embodiments of the present disclosure. The signal conditioner circuit 114 in this example is a typical differential amplifier circuit composed of an op-amp with non-inverting and inverting inputs connected as shown through resistors R1 and R2, respectively, to a pair of sensors 112. When connected thusly, the op-amp amplifies any difference that may arise in the voltages from the two sensors 112, for example, due to arc formation in one of the branch breakers 104. The op amp then outputs the amplified difference as a trigger signal to the main breaker 106 to detect the arc formation. An advantage of the differential amplifier circuit over the single-ended amplifier circuit is that the differential amplifier provides better noise reduction, although the signal level may be more reduced. Suitable commercially available op-amps that may be used in this embodiment include the TLV1805 high-voltage op-amp from Texas Instruments.

Figure 2C:
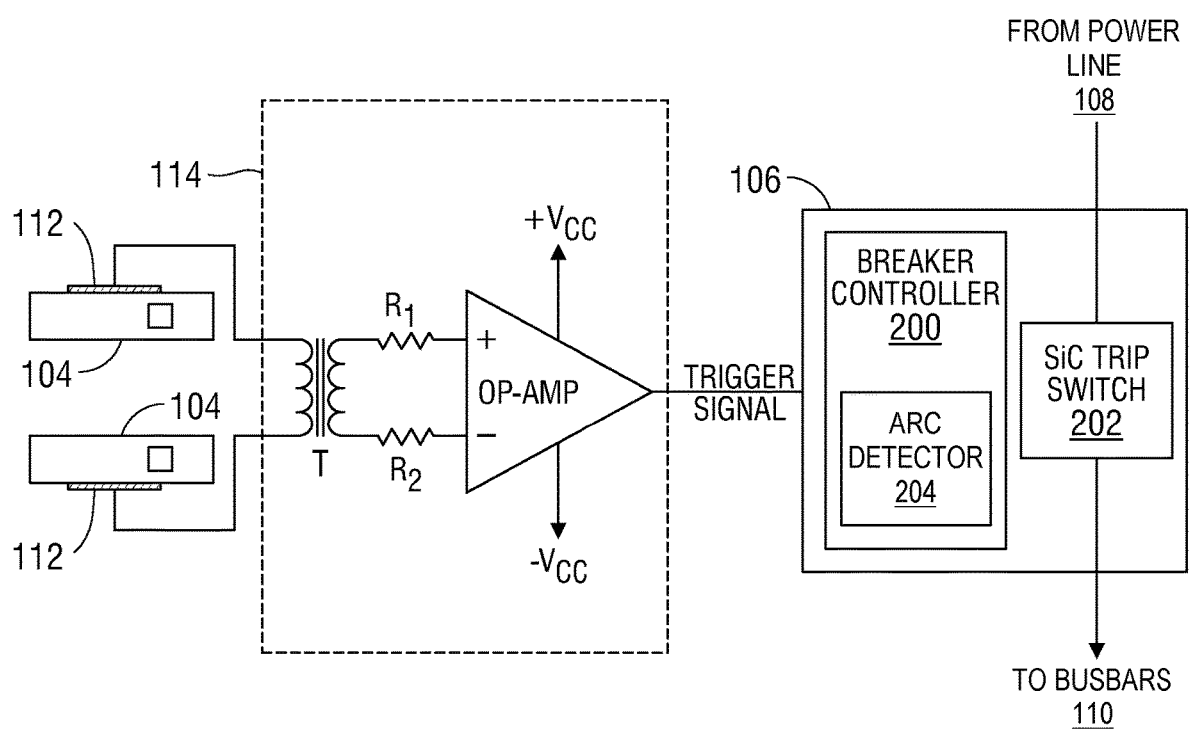

FIG. 2C shows yet another exemplary signal conditioner circuit 114 according to embodiments of the present disclosure. The signal conditioner circuit 114 in this example also employs an op-amp in a typical differential amplifier configuration, with non-inverting and inverting inputs connected respectively through resistors R1 and R2 to a pair of sensors 112. However, the sensors 112 in this embodiment are connected to the op-amp inputs via a transformer T for isolation purposes. Operation of this op-amp is otherwise the same as operation of the op-amp in the embodiment of FIG. 2B. In these and other embodiments discussed herein, a shielded twisted-pair cable can be used to provide the connection from the sensors 112 to the op-amp inputs, whether directly (FIGS. 2A-2B) or indirectly (FIG. 2C), to reduce electromagnetic interference.

Figure 3A:
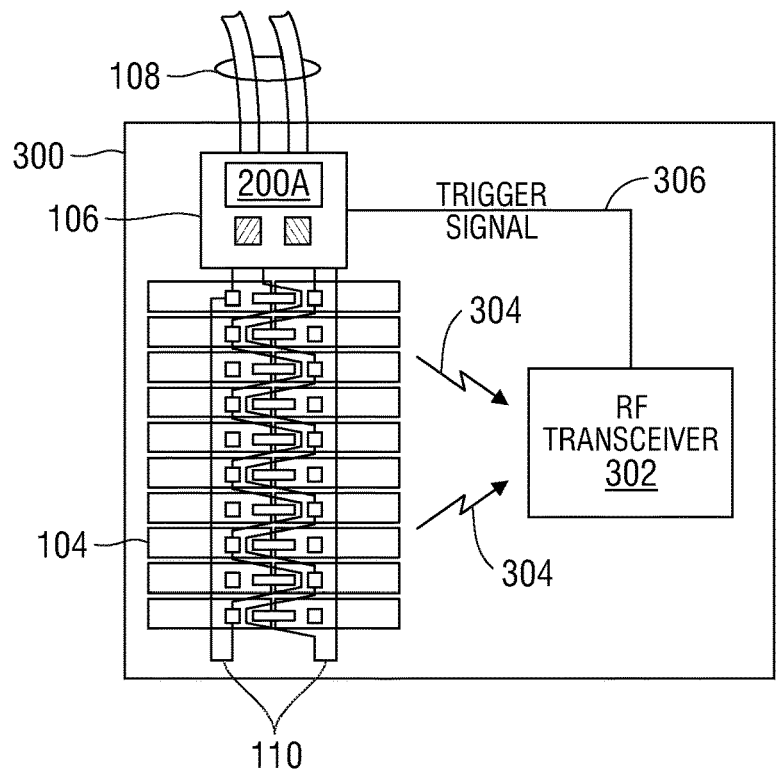
FIGS. 3A-3C are schematic diagrams illustrating exemplary alternative load centers that can suppress arc formation in branch circuit breakers according to embodiments of the present disclosure.

FIG. 3A illustrates an exemplary load center 300 where, instead of capacitive sensors like the sensors 112, a radio frequency (RF) transceiver 302 is used to monitor arc formation in the branch breakers 104. These embodiments take advantage of radio frequency energy 304 being present in the electromagnetic field emitted by an arc to detect arc formation. The RF transceiver 302 can be mounted directly on the load center 300 or as a separate module within detectable range of the load center 300. Suitable commercially available RF transceivers that may be used in these embodiments include the MRF89XA integrated ultra-low-power sub-GHz transceiver from Microchip Technology, Inc., of Chandler, Ariz. Such a transceiver 302 typically has one or more integrated antennas and associated circuitry that can detect or otherwise pick up radio frequency energy 304 from the arc and output a signal proportional to the radio frequency energy. The signal may then be sent as a trigger signal to the main breaker 106 to detect arc formation within the branch breakers 104. In the embodiment shown, the trigger signal is sent to the main breaker 106 over a wired (e.g., shielded twisted-pair) connection 306.

Figure 3B:
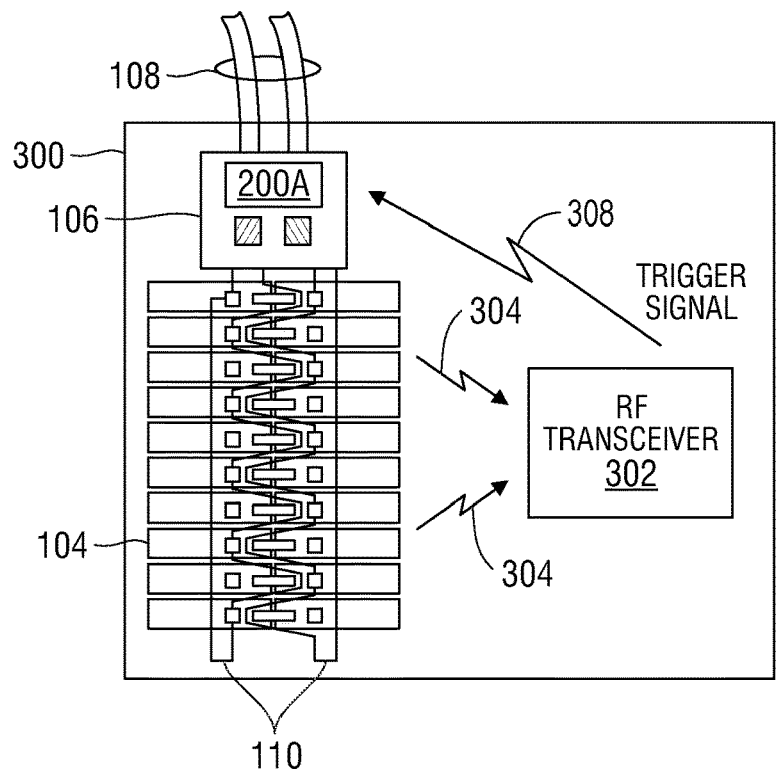

FIG. 3B illustrates an alternative embodiment of the exemplary load center 300 in which the RF transceiver 302 transmits the trigger signal over a wireless connection 308 to the main breaker 106. The wireless connection 308 may be any suitable short to medium range wireless connection, such as Wi-Fi, Bluetooth, LowPan6, WirelessHART, Zigbee, SigFox, RPMA, and the like. The main breaker 106 would of course need to include an appropriate wireless interface (not expressly shown) that can receive such a transmitted trigger signal. In either case, the main breaker 106 processes the trigger signal to determine whether the signal satisfies a predefined condition indicative of arc formation (e.g., matches a certain pattern and/or shape, exceeds a certain amplitude and/or duration, etc.). As with previous embodiments, the predefined condition may be derived, for example, by tripping one of the branch breakers 104 in a controlled setting and analyzing the resulting signal generated by the RF transceiver 302.

Figure 3C:
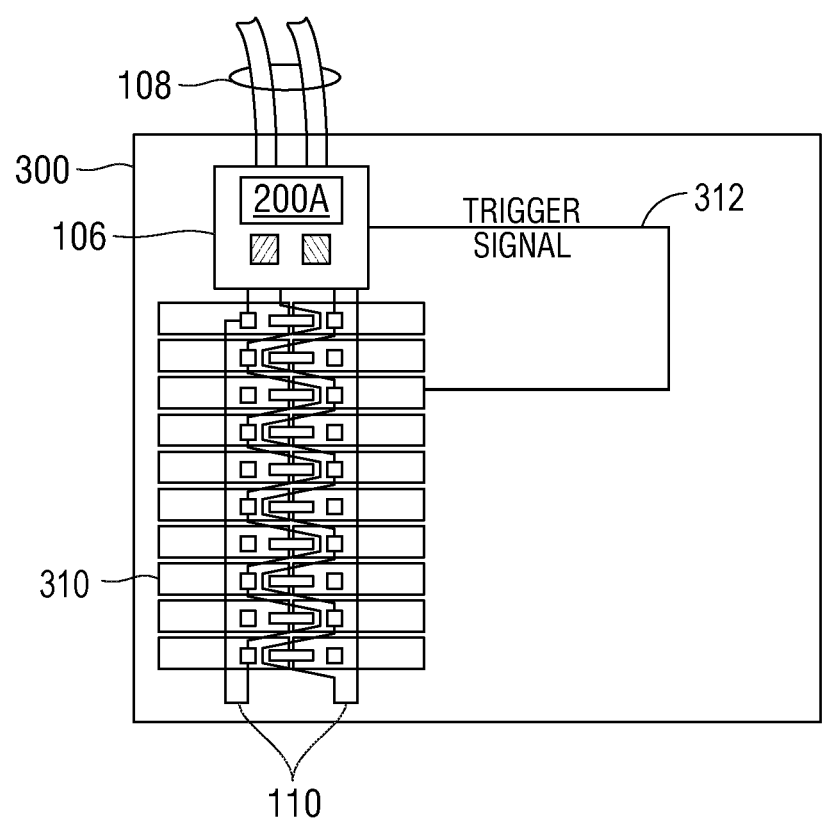

FIG. 3C illustrates yet another alternative embodiment of the exemplary load center 300 where arc suppression is performed without checking for arc formation. In this embodiment, instead of conventional thermal-mechanical breakers, electronic trip circuit breakers 310 are used as the branch breakers. These electronic trip breakers 310 employ a programmable trip unit instead of a bimetallic strip or the like to detect a fault condition and actuate a trip mechanism. The programmable trip unit is typically a microprocessor, microcontroller, ASIC, or other suitable controllers known to those skilled in the art. Commercially available electronic trip breakers that may be used in this embodiment include breakers equipped with the Micrologic Trip System from Schneider Electric USA, Inc., of Boston, Mass.

When a fault condition occurs, logic within the trip unit of the electronic trip circuit breakers 310 detects the fault condition and outputs a trip signal that actuates the trip mechanism. This trip signal may be tapped and sent as a trigger signal to the main breaker 106 over a suitable connection 312 (e.g., shielded twisted-pair). Upon receiving the trip/trigger signal, the main breaker 106 again checks whether signal meets a predefined conditioned before cutting current flow. In this embodiment, the predefined condition can be simply whether the trip/trigger signal satisfies a predefined logic level, such as a logic high (or low) level. The main breaker 106 does not need to determine whether the signal satisfies a predefined condition indicative of arc formation before cutting current flow. Indeed, depending on the particular implementation, it may be possible for current flow to be cut even before the current-carrying contacts of the trip mechanism begin to separate (i.e., before arc formation can begin). Such an arrangement allows the main breaker 106 to perform a type of preemptive suppressing of arc formation.

Thus far, the embodiments disclosed herein have been described with respect to an electrical distribution panel or load center. However, the principles and teachings discussed herein are equally applicable to other types of electrical distribution arrangements, such as a motor control center (MCC), switchgear, and the like. It should therefore be understood that other types of electrical distribution arrangements besides load centers are within the scope of the present disclosure.

Figure 4:
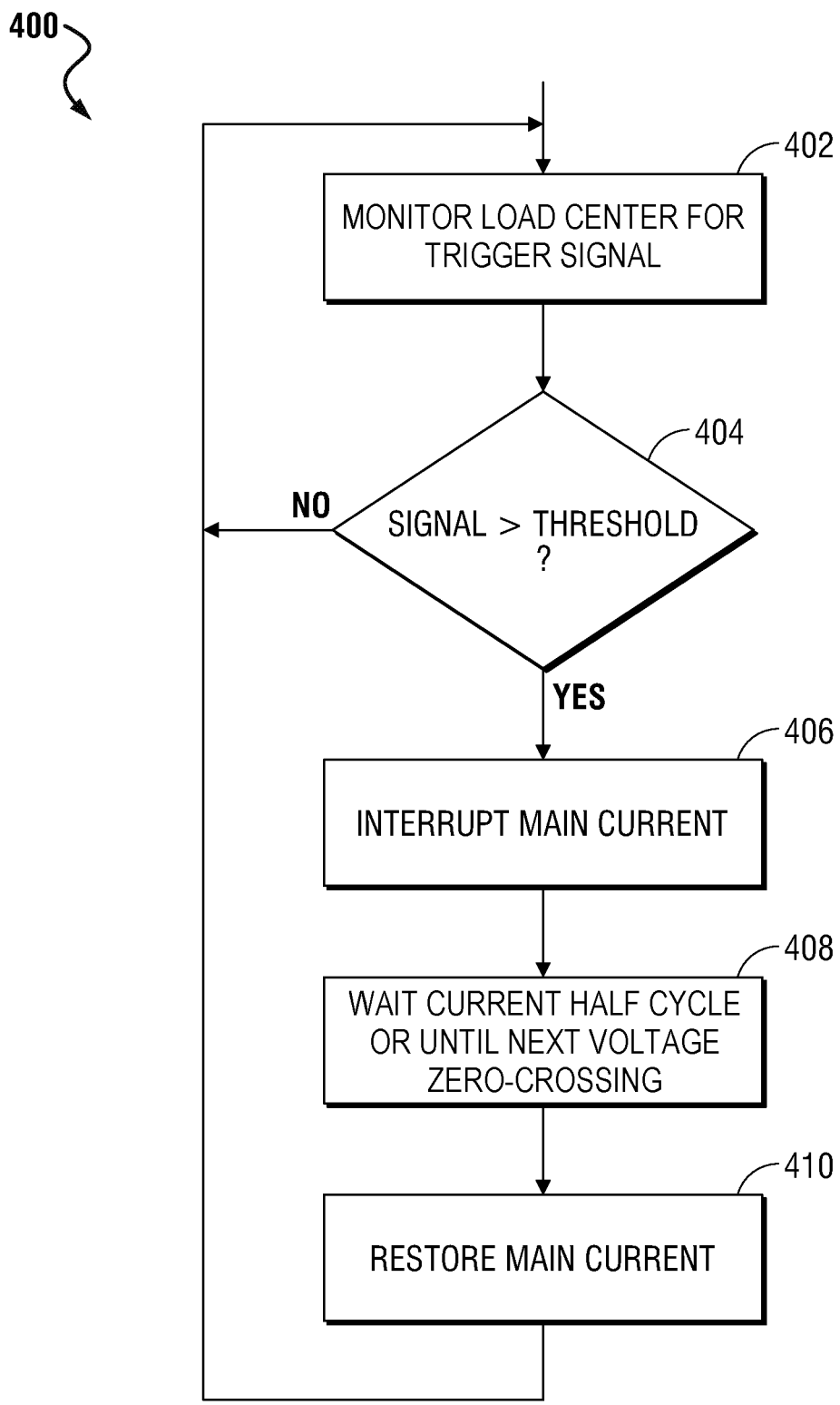
FIG. 4 is a flow diagram illustrating a method of suppressing arcing in a load center according to embodiments of the present disclosure.

Referring now to FIG. 4, an exemplary flowchart 400 is shown representing a method that may be used to suppress arc formation in a load center according to embodiments of the present disclosure. The flowchart 400 generally begins at block 402 where a main breaker monitors the load center for receipt of a trigger signal. In some embodiments, the trigger signal is provided to the main breaker by one or more sensors mounted on or near the load center or the branch breakers therein. In other embodiments, the trigger signal is provided to the main breaker directly by one of the branch breakers in the load center. Where sensors are used, such sensors may include capacitive sensors, RF sensors, and other types of sensors that can detect arc formation within the branch breakers.

Upon receipt of the trigger signal, the main breaker determines whether the trigger signal satisfies a predefined condition at block 404. In some embodiments, the predefined condition is indicative of arc formation, such as whether the signal has a waveform that resembles a certain pattern and/or shape, whether the signal exceeds a certain amplitude, duration, and/or other threshold, and the like. In other embodiments, the predefined condition is a certain logic level. If the determination is no, then main breaker returns to block 402 and continues to monitor the load center for receipt of the trigger signal.

If the determination is yes, then the main breaker temporarily interrupts current flow to the busbars in the load center at block 406. The main breaker thereafter waits at block 408 for occurrence of a predefined event, such as an immediately next zero-crossing of the load center voltage, a fixed amount of time, such as a half cycle of the load center current, and the like. In either case, the wait period should be long enough to allow the tripped branch breaker to clear, but short enough to avoid adversely affecting the electronic devices on other branch breakers. Upon occurrence of the predefined event, the main breaker restores current flow to the busbars of the load center at block 410, and returns to block 402 for continued monitoring of the branch breakers.

Figure 5A:
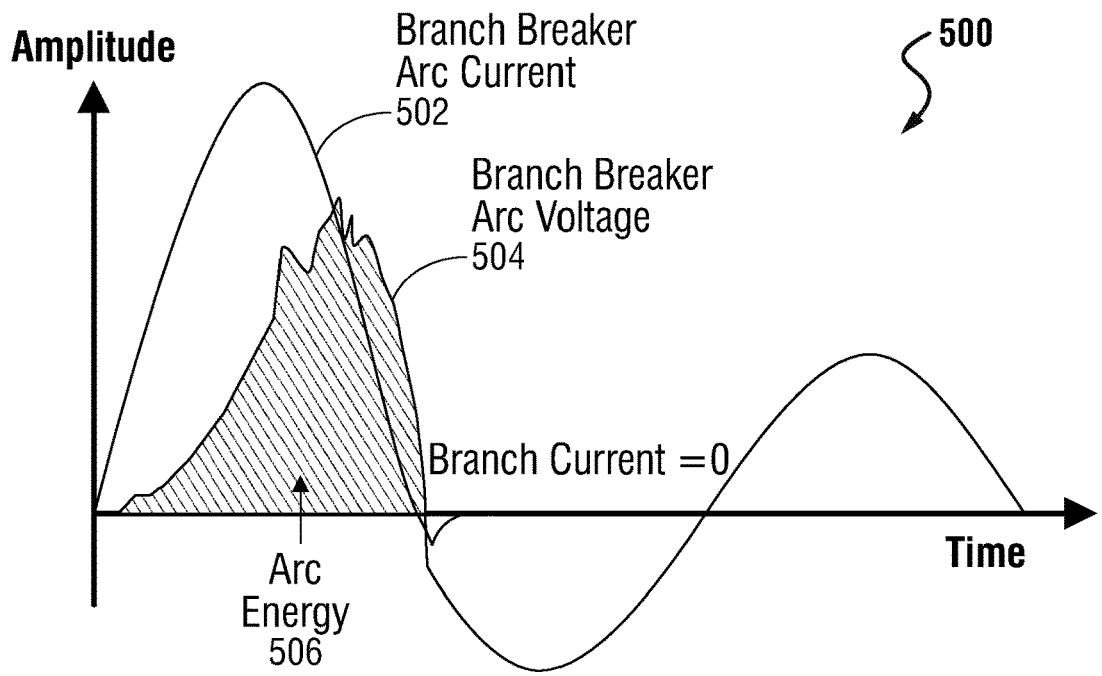
FIGS. 5A-5B are current and voltage plots illustrating exemplary arc suppression in a load center according to embodiments of the present disclosure.
Figure 5B:
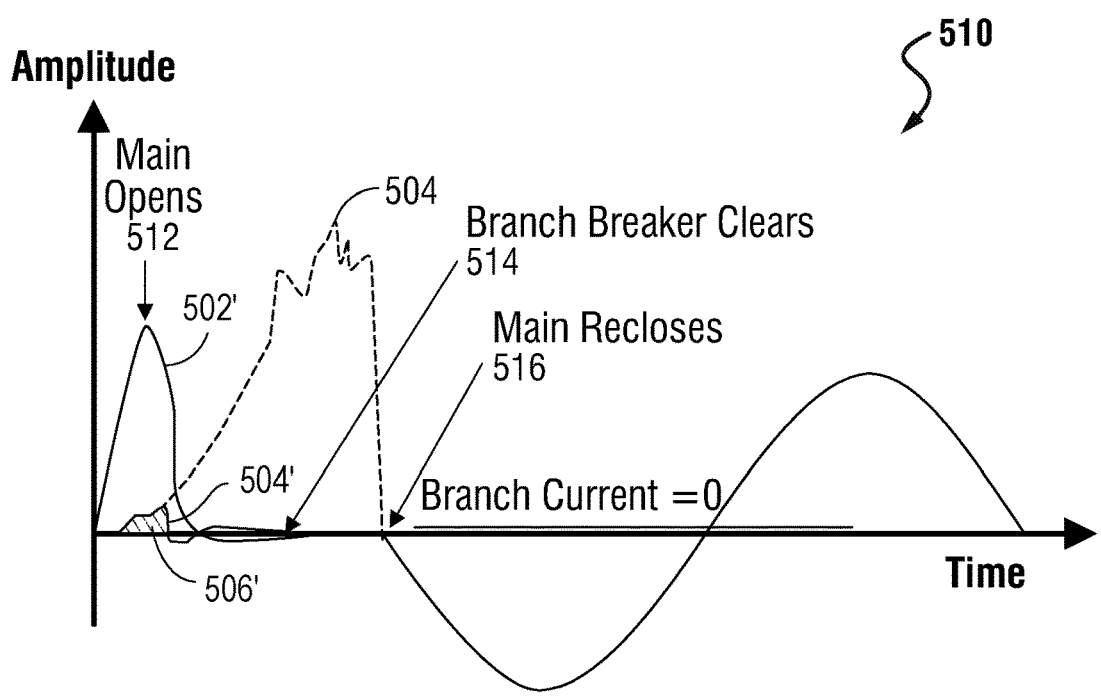

FIG. 5A-5B are current and voltage plots illustrating exemplary arc suppression in a load center according to some embodiments of the present disclosure. In these plots, the vertical axis represents amplitude, the horizontal axis represents time, and the origin represents opening of the current-carrying contacts of a branch breaker.

Referring first to FIG. 5A, plot 500 shows a branch breaker arc current 502 and a branch breaker arc voltage 504 in which no arc suppression is performed by the main breaker. As can be seen, current 502 continues to flow shortly after opening of the current-carrying contacts of the branch breaker due to an arc forming between the contacts. The arc has an energy that is represented by the shaded area 506 under voltage 504. This arc energy 506 is fed by current 502 until the current-carrying contacts eventually move too far apart for the arc to be sustained and dissipates, at which point current 502 goes to zero.

In FIG. 5B, plot 510 shows a branch breaker arc current 502' and a branch breaker arc voltage 504' in which arc suppression is performed by the main breaker according to embodiments of the present disclosure. As before, current 502' continues to flow shortly after opening of the current-carrying contacts of the branch breaker due to an arc being formed between the contacts. Here, however, the arc formation is detected as described above by the main breaker, which quickly cuts off current flow at 512. Without current flow to sustain it, the arc rapidly dissipates, thus significantly reducing the amount of arc energy 506' compared to the arc energy 506 shown in FIG. 5A. The main breaker thereafter waits a brief time period to allow the branch breaker to clear at 514, then restores current flow at the next voltage zero-crossing at 516.

In the preceding, reference is made to various embodiments. However, the scope of the present disclosure is not limited to the specific described embodiments. Instead, any combination of the described features and elements, whether related to different embodiments or not, is contemplated to implement and practice contemplated embodiments. Furthermore, although embodiments may achieve advantages over other possible solutions or over the prior art, whether or not a particular advantage is achieved by a given embodiment is not limiting of the scope of the present disclosure. Thus, the preceding aspects, features, embodiments and advantages are merely illustrative and are not considered elements or limitations of the appended claims except where explicitly recited in a claim(s).

The various embodiments disclosed herein may be implemented as a system, method or computer program product. Accordingly, aspects may take the form of an entirely hardware embodiment, an entirely software embodiment (including firmware, resident software, micro-code, etc.) or an embodiment combining software and hardware aspects that may all generally be referred to as a "circuit," "module" or "system." Furthermore, aspects may take the form of a computer program product embodied in one or more computer-readable medium(s) having computer-readable program code embodied thereon.

Any combination of one or more computer-readable medium(s) may be utilized. The computer-readable medium may be a non-transitory computer-readable medium. A non-transitory computer-readable medium may be, for example, but not limited to, an electronic, magnetic, optical, electromagnetic, infrared, or semiconductor system, apparatus, or device, or any suitable combination of the foregoing. More specific examples (a non-exhaustive list) of the non-transitory computer-readable medium can include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. Program code embodied on a computer-readable medium may be transmitted using any appropriate medium, including but not limited to wireless, wireline, optical fiber cable, RF, etc., or any suitable combination of the foregoing.

Computer program code for carrying out operations for aspects of the present disclosure may be written in any combination of one or more programming languages. Moreover, such computer program code can execute using a single computer system or by multiple computer systems communicating with one another (e.g., using a local area network (LAN), wide area network (WAN), the Internet, etc.). While various features in the preceding are described with reference to flowchart illustrations and/or block diagrams, a person of ordinary skill in the art will understand that each block of the flowchart illustrations and/or block diagrams, as well as combinations of blocks in the flowchart illustrations and/or block diagrams, can be implemented by computer logic (e.g., computer program instructions, hardware logic, a combination of the two, etc.). Generally, computer program instructions may be provided to a processor(s) of a general-purpose computer, special-purpose computer, or other programmable data processing apparatus. Moreover, the execution of such computer program instructions using the processor(s) produces a machine that can carry out a function(s) or act(s) specified in the flowchart and/or block diagram block or blocks.

The flowchart and block diagrams in the Figures illustrate the architecture, functionality and/or operation of possible implementations of various embodiments of the present disclosure. In this regard, each block in the flowchart or block diagrams may represent a module, segment or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

It is to be understood that the above description is intended to be illustrative, and not restrictive. Many other implementation examples are apparent upon reading and understanding the above description. Although the disclosure describes specific examples, it is recognized that the systems and methods of the disclosure are not limited to the examples described herein, but may be practiced with modifications within the scope of the appended claims. Accordingly, the specification and drawings are to be regarded in an illustrative sense rather than a restrictive sense. The scope of the disclosure should, therefore, be determined with reference to the appended claims, along with the full scope of equivalents to which such claims are entitled.

We claim:

1. A load center, comprising:
   a plurality of branch breakers;
   at least one sensor coupled to the plurality of branch breakers, the at least one sensor configured to sense a parameter indicative of arc formation in one of the branch breakers; and
   a solid-state main breaker coupled to receive a trigger signal from the at least one sensor, the solid-state main breaker configured to determine whether the trigger signal satisfies a predefined arcing condition and, in response, temporarily interrupt current flow to the plurality of branch breakers and wait for a predefined event before restoring current flow to the plurality of branch breakers, wherein the predefined event comprises at least one of (i) a predefined time period substantially equal to a half cycle of a load center current or (ii) an immediately next zero-crossing of a load center voltage.

2. The load center of claim 1, wherein the at least one sensor comprises one sensor coupled to each of the plurality of branch breakers.

3. The load center of claim 1, wherein the at least one sensor comprises one sensor coupled to multiple ones of the plurality of branch breakers.

4. The load center of claim 1, wherein the at least one sensor includes a voltage sensor and the parameter is voltage induced by arc formation in one of the branch breakers, and the load center further comprises a signal conditioning circuit connected to the voltage sensor.

5. The load center of claim 1, wherein the at least one sensor includes a radio frequency sensor and the parameter is radio frequency energy generated by arc formation in one of the branch breakers.

6. A main breaker for a load center, comprising:
   a solid-state trip switch configured to provide current flow to a plurality of branch breakers; and
   a breaker controller configured to control switching of the solid-state trip switch, the breaker controller operable to receive a trigger signal resulting from a fault condition in one of the branch breakers and determine whether the trigger signal satisfies a predefined condition;
   wherein the breaker controller is further operable to temporarily interrupt current flow to the branch breakers and wait for a predefined event before restoring current flow to the branch breakers in response the trigger signal satisfying the predefined condition, wherein the predefined event comprises at least one of (i) a predefined time period substantially equal to a half cycle of a load center current or (ii) an immediately next zero-crossing of a load center voltage.

7. The main breaker of claim 6, wherein the trigger signal is received from at least one sensor coupled the branch breakers and represents one of: a voltage induced by arc formation in one of the branch breakers, or radio frequency energy generated by arc formation in one of the branch breakers.

8. The main breaker of claim 6, wherein the predefined condition is one of: a predefined logic level, or a predefined arcing condition.

9. The main breaker of claim 8, wherein the predefined arcing condition includes the trigger signal having one or more of: a predefined waveform, shape, amplitude, and duration.

10. A method of suppressing arc formation in a load center, comprising:
    receiving, at a main breaker, a trigger signal resulting from a fault condition in one of a plurality of branch breakers in the load center;
    determining, at the main breaker, whether the trigger signal satisfies a predefined condition;
    temporarily interrupting, at the main breaker, current flow to the plurality of branch breakers in response to the trigger signal satisfying the predefined condition; and
    restoring, at the main breaker, current flow to the plurality of branch breakers after occurrence of a predefined event, wherein the predefined event comprises at least one of (i) a predefined time period substantially equal to a half cycle of a load center current or (ii) an immediately next zero-crossing of a load center voltage.

11. The method of claim 10, further comprising coupling a sensor to each of the plurality of branch breakers or coupling at least one sensor to multiple ones of the plurality of branch breakers.

12. The method of claim 10, wherein the predefined condition is one of: a predefined logic level, or a predefined arcing condition.

13. The method of claim 12, wherein the predefined arcing condition includes the trigger signal having one or more of: a predefined waveform, shape, amplitude, and duration.

14. The method of claim 10, wherein the trigger signal is received from at least one sensor coupled the branch breakers, further comprising conditioning the trigger signal at a signal conditioning circuit connected to the at least one sensor.

15. The method of claim 14, wherein the trigger signal represents one of: a voltage induced by arc formation in one of the branch breakers, or radio frequency energy generated by arc formation in one of the branch breakers.

* * * * *